(12) United States Patent
Schoenmaker et al.

(10) Patent No.: US 6,453,275 B1
(45) Date of Patent: Sep. 17, 2002

(54) METHOD FOR LOCALLY REFINING A MESH

(75) Inventors: Wim Schoenmaker, Genk; Wim Magnus, Waver, both of (BE)

(73) Assignee: Interuniversitair Micro-Elektronica Centrum (IMEC vzw), Leuven (BE)

( * ) Notice: Subject to any disclaimer, the term of this patent is extended or adjusted under 35 U.S.C. 154(b) by 0 days.

(21) Appl. No.: 09/328,882

(22) Filed: Jun. 9, 1999

Related U.S. Application Data

(60) Provisional application No. 60/088,679, filed on Jun. 19, 1998.

(51) Int. Cl.$^7$ .............................................. G06F 17/10
(52) U.S. Cl. ............................................. 703/2; 716/20
(58) Field of Search .......................... 703/2, 1; 716/20; 345/419, 420

(56) References Cited

U.S. PATENT DOCUMENTS

| | | | | |
|---|---|---|---|---|
| 6,064,810 A | * | 5/2000 | Raad et al. | 703/23 |
| 6,137,492 A | * | 10/2000 | Hoppe | 345/420 |
| 6,266,062 B1 | * | 7/2001 | Rivara | 345/419 |

OTHER PUBLICATIONS

E.M. Buturla, et al., "Finite–Element Analysis of Semiconductor Devices: The Fielday Program", IBM Journal on Research and Development, vol. 25, No. 4, pp. 218–231, Jul. 1981.

A. De Mari, "An Accurate Numerical One–Dimensional Solution of the p–n Junction Under Arbitrary Transient Conditions", Solid State Electronics, vol. 11 pp. 1021–1053, 1968.

H.K. Dirks, "Quasi–Stationary Fields for Microelectronic Applications", Electrical Engineering, vol. 79, pp. 145–155, 1996.

H. Hasegawa, et al., "Properties of Microstrip Line on Si–SiO System", IEEE Trans. On Microwave Theory and Techniques, vol. MTT–19, No. 11, Nov. 1971.

S.E. Laux, "Technique for Small Signal Analysis of Semiconductor Devices" IEEE Trans. On Computer Aided Design, vol. CAD–4, No. 4, Oct. 1985.

D.L. Scharfetter, et al., "Large–Signal Analysis of a Silicon Read Diode Oscillator", IEEE Trans. on Electronic Devices. vol. ED–16, No. 1, Jan. 1969.

Albanese, R., et al., "Numerical Procedures for the Solution of Nonlinear Electromagnetic Problems", IEEE Transactions on Magnetics, vol. 28, No. 2, Mar. 1992. XP–002181720.

Zheng, Ji, et al., "CAD–Oriented Equivalent–Circuit Modeling of Off–Chip Interconnects on Lossy Silicon Substrate", IEEE Transactions on Microwave Theory and Techniques, vol. 48, No. 9, Sep. 2000. XP–002181721.

(List continued on next page.)

*Primary Examiner*—Russell Frejd
(74) *Attorney, Agent, or Firm*—Knobbe, Martens, Olson & Bear, LLP

(57) ABSTRACT

A method, i.e. the so-called Cube-Assembling Method (CAM), is disclosed for locally refining a n-dimensional mesh in a predetermined domain, wherein the mesh comprises nodes and n−1 planes connecting these nodes thereby dividing said domain in n-dimensional first elements. By applying a mesh on a domain, the domain can be introduced in a computer aided design environment for optimization purposes. Concerning the mesh, one of the issues is to perform the optimization using the appropriate amount of nodes at the appropriate location The method of the present invention succeeds in adding or removing nodes locally. The assembling is done over the elements, being e.g. squares or cubes or hypercubes dependent of the dimension of the mesh. Like the finite-box method, the CAM method is easy to program, even in higher dimensions. However, the CAM method does not suffer from the restriction that only one line may terminate at the side of a box.

17 Claims, 13 Drawing Sheets-

OTHER PUBLICATIONS

Nyka, K., et al., "Combining Function Expansion and Multigrid Method for Efficient Analysis of MMIC's", 11$^{th}$ International Microwave Conference, Warsaw, Poland, May 1996. XP–001033645.

"Finite Boxes—A generalization of the Finite–difference Method Suitable for Semiconductor Device Simulation" A. F. Franz, G. A. Franz, S. Selberherr, C. Ringhofer and P. Markowich, IEEE Trans. on Elec. Dev. ED–30, 1070 (1983).

"Confinement of Quarks" K. Wilson Phys Rev. D10, 2445 (1974).

Grosso et al., "The Multilevel Finite Element Method for Adaptive Mesh Optimization and Visualization of Volume Data", Proceedings Visualization '97, pp. 387–394, Oct. 1997.*

Hoppe H., "Smooth View–Dependent Level–of–detail Control and its Appliction to Terrain Rendering", Proceedings Visualization '98, pp. 35–42, Oct. 1998.*

Klingbell et al., "A Local Mesh Refinement Algorithm for the FDFD Method Using a Polygonal Grid", IEEE Microwave and Guided Wave Letters, vol. 6, Issue 1, pp. 52–54, Jan. 1996.*

Monorchio et al., "A Novel Subgridding Scheme Based on a Combination of the Finite–Element and Finitie–Difference Time–Domain Methods", IEEE Transactions on Antennas and Propagation, vol. 46, Issue 9, pp. 1391–1393, Sep. 1998.*

Kulke et al., "Multigrid Technique with Local Grid Refinement for Solving Static Field Problems (RF Circuits)", IEEE MTT–S International Microwave Symposium, vol. 1, pp. 29–32, Jun. 1998.*

* cited by examiner

METHOD FOR LOCALLY REFINING A MESH

RELATED APPLICATIONS

This application incorporates by reference, in its entirety, and claims priority to U.S. Provisional Patent Application No. 60/088,679, filed on Jun. 9, 1998.

FIELD OF THE INVENTION

The invention relates to computer aided design methods in general for structures in a variety of technical fields and in particular for semiconductor devices.

DESCRIPTION OF THE RELATED TECHNOLOGY

Many problems in engineering, physics and chemistry require to solve systems of partial differential equations of the type:

$$\vec{\nabla} \cdot \vec{J}^{(k)} + \frac{\partial \rho^{(k)}}{\partial t} = S^{(k)};$$

k being a positive whole number

In this equation (equation 1), J represents a flux of a substance under consideration whose density is given by ρ and S represents some external source/sink of the substance. To mention a few examples:
Electrical Engineering:
  ρ is the charge density,
  J is the current density,
  S is the external charge source (recombination, generation)
Structural Engineering
Computational Fluid Dynamics:
  $\rho^{(i)}=u^{(i)}$ the components of the fluid velocity field,
  $J^{(i)}=P-\frac{1}{3}\nabla.u^{(i)}$ the pressure tensor,
  $S^{(i)}=\eta/\rho \nabla^2 u^{(i)}+F^{(i)}/m$ the external force, $$\frac{\partial \rho}{\partial t} \rightarrow \frac{\partial \rho}{\partial t} + \vec{\nabla} \cdot \vec{u}$$

the convective derivative.

The list is not exhaustive and there exist many examples where problems are reformulated in such a form that their appearance is as in equation (1). An important example is the Laplace equation and Poisson equation, in which $$\vec{J} = \vec{\nabla}\psi$$

is the derivative of a scalar field.

There have been presented a number of methods for solving a set of partial differential equations as given above. All numerical methods start from representing the continuous problem by a discrete problem on a finite set of representative nodes in the domain where one is interested in the solution. In other words a mesh is generated in a predetermined domain. The domain can be almost anything ranging from at least a part of or a cross-section of a car to at least a part of or a cross-section of a semiconductor device. For clarification purposes, we limit the discussion here to two-dimensional domains and two-dimensional meshes. This mesh comprises nodes and lines connecting these nodes. As a result, the domain is divided into two-dimensional elements. The shape of the elements depends amongst others on the coordinate system which is chosen. If for example a Cartesian coordinate system is chosen, the two-dimensional elements are e.g. rectangles or triangles. Using such a mesh, the domain can be introduced in a computer aided design environment for optimization purposes. Concerning the mesh, one of the issues is to perform the optimization using the appropriate amount of nodes at the appropriate location. There is a minimum amount of nodes required in order to ensure that the optimization process leads to the right solution at least within predetermined error margins. On the other hand, if the total amount of nodes increases, the complexity increases and the optimization process slows down or even can fail. Because at the start of the optimization process, the (initial) mesh usually thus not comprise the appropriate amount of nodes, additional nodes have to be created or nodes have to be removed. Adding nodes is called mesh refinement whereas removing nodes is called mesh coarsening. Four methods are discussed. As stated above, for clarification and simplification purposes we use the 'language' of two dimensions, but all statements have a translation to three or more dimensions.

The finite-difference method is the most straightforward method for putting a set of partial differential equations on a mesh. One divides the coordinate axes into a set of intervals and a mesh is constructed by all coordinate points and replaces the partial derivatives by finite differences. The method has the advantage that it is easy to program, due to the regularity of the mesh. The disadvantage is that during mesh refinement many spurious additional nodes are generated in regions where no mesh refinement is needed.

The finite-box method, as e.g. in A. F. Franz, G. A. Franz, S. Selberherr, C. Ringhofer and P. Markowich "Finite Boxes—A Generalization of the Finite-Difference Method Suitable for Semiconductor Device Simulation" IEEE Trans. on Elec. Dev. ED-30, 1070 (1983), is an improvement of the finite-difference method, in the sense that not all mesh lines need to terminate at the domain boundary. The mesh lines may end at a side of a mesh line such that the mesh consists of a collection of boxes, i.e. the elements. However, numerical stability requires that at most one mesh line may terminate at the side of a box. Therefore mesh refinement still generates a number of spurious points. The issue of the numerical stability can be traced to the five-point finite difference rule that is furthermore exploited during the refinement.

The finite-element method is a very popular method because of its high flexibility to cover domains of arbitrary shapes with triangles. The choice in favor of triangles is motivated by the fact that each triangle has three nodes and with three points one can parameterize an arbitrary linear function of two variables, i.e. over the element the solution is written as $$\psi(x,y)=a+b.x+c.y$$

In three dimensions one needs four points, i.e. the triangle becomes a tetrahedron. The assembling strategy is also element by element. Sometimes for CPU time saving reasons, one performs a geometrical preprocessing such that the assembling is done link-wise, but this does not effect the element-by-element discretization and assembling. The disadvantage is that programming requires a lot of work in order to allow for submission of arbitrary complicated domains. Furthermore, adaptive meshing is possible but obtuse triangles are easily generated and one must include algorithms to repair these deficiencies, since numerical stability and numerical correctness suffers from obtuse triangles. As a consequence, mesh refinement and in particular adaptive meshing, generates in general spurious nodes.

The finite-element method is not restricted to triangles in a plane. Rectangles (and cubes in three dimensions) have become popular. However, the trial functions are always selected in such a way that a unique value is obtained on the interface. This restriction makes sense for representing scalar functions ψ(x,y) on a plane In the box-integration method, each node is associated with an area (volume) being determined by the nodes located at the closest distance from this node or in other words, the closest neighbouring node in each direction. Next, the flux divergence equation is converted into an integral equation and using Gauss theorem, the flux integral of the surface of each volume is set equal to the volume integral at the right hand side of the equation, i.e. equation 1 becomes $$\int_{\partial\Omega_n} \vec{J}^{(i)} \cdot (\vec{d})_s = \int_{\Omega_n} \left( S^{(i)} - \frac{\partial \rho^{(i)}}{\partial t} \right) d^n x$$

The assembling is done node-wise, i.e. for each node the surface integral is decomposed into contributions to neighboring nodes and the volume integral at the right-hand side is approximated by the volume times the nodal value. The spatial discretization of the equation then becomes $$\sum_k J_{lk} \frac{\partial \Omega_{lk}}{h_{lk}} = \left( S_l^{(i)} - \frac{\partial \rho_l^{(i)}}{t} \right) \Delta \Omega_l$$

The advantages/disadvantages of the method are similar as for the Finite element method because the control volumes and the finite elements are conjugate or dual meshes. Voronoi tessellation with the Delaunay algorithm is often exploited to generate the control volumes.

AIM OF THE INVENTION

Summary of the Invention

In an aspect of the invention a method, i.e. the so-called Cube-Assembling Method (CAM), is disclosed for locally refining a n-dimensional mesh in a predetermined domain, wherein the mesh comprises nodes and n−1 planes connecting these nodes thereby dividing said domain in n-dimensional first elements. The domain can be almost anything ranging from at least a part of a car to at least a part of a semiconductor device. For clarification purposes, we limit the discussion here to two-dimensional domains and two-dimensional meshes. The shape of the elements depends amongst others on the coordinate system which is chosen. By applying a mesh on a domain, the domain can be introduced in a computer aided design environment for optimization purposes. Concerning the mesh, one of the issues is to perform the optimization using the appropriate amount of nodes at the appropriate location. There is a minimum amount of nodes required in order to ensure that the optimization process leads to the right solution at least within predetermined error margins. On the other hand, if the total amount of nodes increases, the complexity increases and the optimization process slows down or even can fail. Because at the start of the optimization process, the (initial) mesh usually thus not comprise the appropriate amount of nodes, additional nodes have to be created or nodes have to be removed during the optimization process. Adding nodes is called mesh refinement whereas removing nodes is called mesh coarsening. The method of the present invention succeeds in adding or removing nodes locally. The assembling is done over the elements, being e.g. squares or cubes or hypercubes dependent of the dimension of the mesh. Like the finite-box method, the CAM method is easy to program, even in higher dimensions. However, the CAM method does not suffer from the restriction that only one line may terminate at the side of a box.

According to this aspect of the invention, a method is disclosed for locally refining a n-dimensional mesh in a predetermined domain, wherein the mesh comprises nodes and n−1 planes connecting these nodes thereby dividing said domain in n-dimensional first elements whereby each element is defined by $2^n$ nodes, said method comprising at least the steps of:

creating a first additional node inside at least one of said first elements by completely splitting said first element in exactly $2^n$ n-dimensional second elements in such a manner that said first additional node forms a corner node of each of said second elements which results in the replacement of said first element by said $2^n$ n-dimensional second elements; and creating a second additional node inside at least one of said second elements by completely splitting said second element in exactly $2^n$ n-dimensional third elements in such a manner that said second additional node forms a corner node of each of said third elements which results in the replacement of said second element by said $2^n$ n-dimensional third elements.

In an embodiment of the invention after the mesh is locally refined, this mesh is locally coarsened.

In another embodiment of the invention, the refinement is based on an adaptive meshing strategy.

In another aspect of the invention, a program storage device is disclosed storing instructions that when executed by a computer perform the method for locally refining a n-dimensional mesh in a predetermined domain, wherein the mesh comprises nodes and n−1 planes connecting these nodes thereby dividing said domain in n-dimensional first elements whereby each element is defined by $2^n$ nodes, said method comprising at least the steps of:

creating a first additional node inside at least one of said first elements by completely splitting said first element in exactly $2^n$ n-dimensional second elements in such a manner that said first additional node forms a corner node of each of said second elements which results in the replacement of said first element by said $2^n$ n-dimensional second elements; and creating a second additional node inside at least one of said second elements by completely splitting said second element in exactly $2^n$ n-dimensional third elements in such a manner that said second additional node forms a corner node of each of said third elements which results in the replacement of said second element by said $2^n$ n-dimensional third elements.

In an aspect of the invention a method is disclosed for optimizing of a predetermined property of a n-dimensional structure, said method comprising the steps of:

creating a n-dimensional mesh on at least a part of said structure; said mesh containing nodes and n−1 planes connecting these nodes thereby dividing said domain in n-dimensional first elements whereby each element is defined by $2^n$ first element;

refining said n-dimensional mesh by creating a first additional node inside at least one of said first elements by completely splitting said first element in exactly $2^n$ n-dimensional second elements in such a manner that said first additional node forms a corner node of each of said second elements which results in the replacement of said first element by said $2^n$ n-dimensional second elements;

further refining said n-dimensional mesh by creating a second additional node inside at least one of said second elements by completely splitting said second element in exactly $2^n$ n-dimensional third elements in such a manner that said second additional node forms a corner node of each of said third elements which results in the replacement of said second element by said $2^n$ n-dimensional third elements; and where said n-dimensional mesh is used to create an improved structure.

In an embodiment of the invention said structure improvements are based on extracting said property from structure characteristics, determined at a subset of said nodes of said mesh.

In a further embodiment of the invention said structure characteristics are determined by solving the partial differential equations, describing the physical behaviour of said structure, on said mesh.

One embodiment of the invention includes a method for locally refining a mesh which can be exploited for improving computer aided design methods.

DETAILED DESCRIPTION OF THE INVENTION

Figure 1:
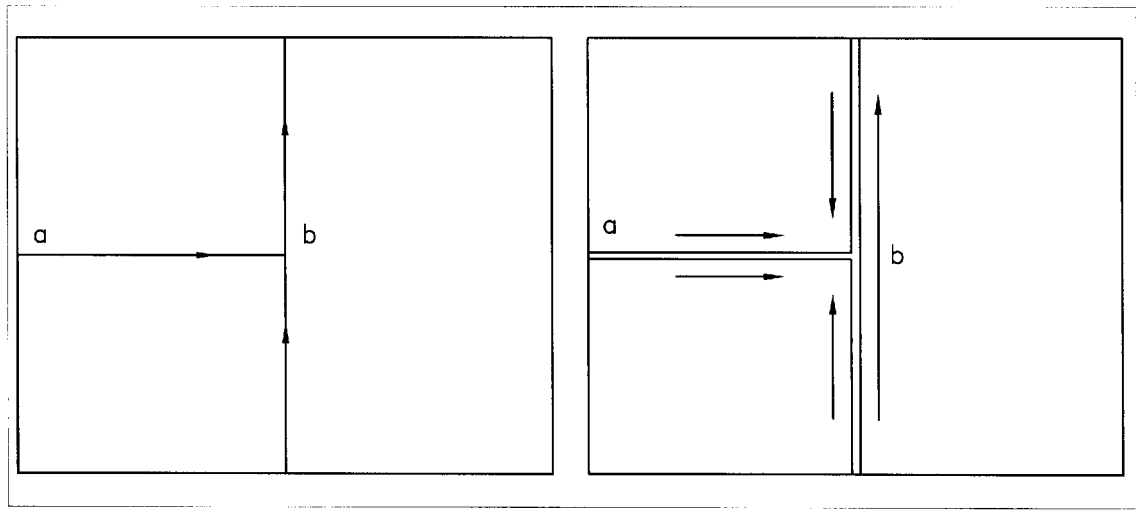
FIG. 1 depicts the assembling strategy, according to an embodiment of the invention. The flux in link ab is composed of two parts: a contribution from the lower rectangle (element) and a contribution from the upper rectangle (element).
Figure 2:
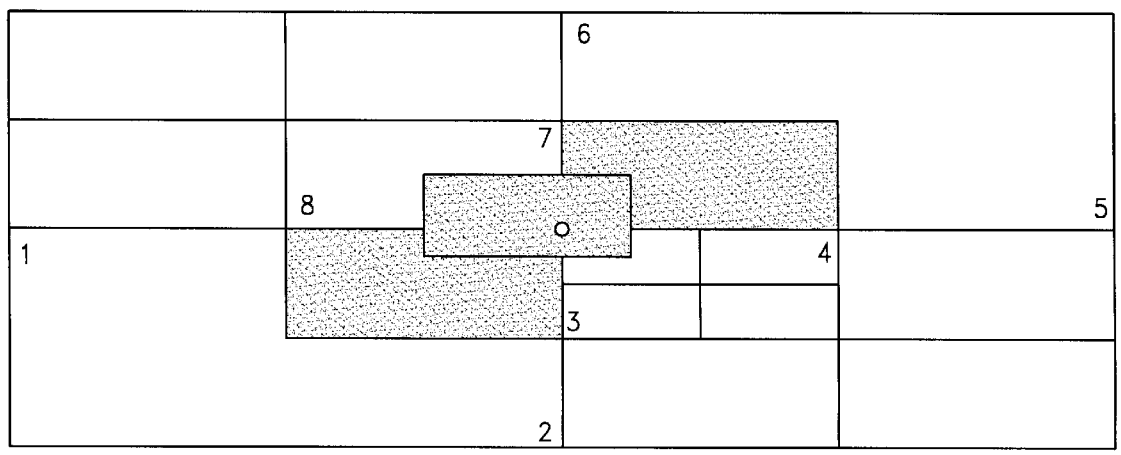
FIG. 2 depicts a mesh according to an embodiment of the invention, wherein each node is associated with an area, i.e. the black area, being determined by the center node. Each node is connected to at most eight different nodes in the mesh. Said nodes being the points for which the center node is the closet node within the element under consideration.

In an embodiment of the invention, as an example, a method is disclosed for refining a rectangular 2-dimensional mesh in a predetermined domain. The rectangular mesh comprises nodes and one-dimensional planes, i.e. lines, connecting these nodes. As a result, the domain is divided into 2-dimensional rectangular first elements whereby each element is defined by $2^2$ nodes, i.e. rectangles. The assembling is performed over these rectangles which makes sense despite the fact that the rectangles have four nodes. Indeed, if we would model the solution as a linear function over a rectangle, the number of conditions for finding the coefficients would result into an overdetermined problem. Therefore the interpolation is dependent of the purpose for which the interpolation is used. For post-processing one may complete the mesh with a Delaunay tessellation and exploit linear interpolation, however, for solving the system of equations, only the end point values of each link or side are entering the equations. A link (see FIG. 1) is a connection between two adjacent nodes and forms a side of a rectangle. In fact such a link is shared by a first and a second rectangle, said first rectangle and said second rectangle being adjacent rectangles, and has a two-fold purpose. The link serves as the flux carrier for the first as well as the second rectangle, e.g. the top rectangle and the bottom rectangle. However, the flux of said first rectangle and the flux of said second rectangle are considered to be non-interacting and therefore, they satisfy the superposition principle. This is illustrated in FIG. 1. It is this observation that allows for a stable and correct assembling strategy using rectangles instead of triangles. In this assembling strategy, particularly in two dimensions, each node is connected to at most eight different sites in the lattice, since each rectangle can generate a connection to two different nodes. These nodes may all be different, although this is not a necessity.

Figure 5:
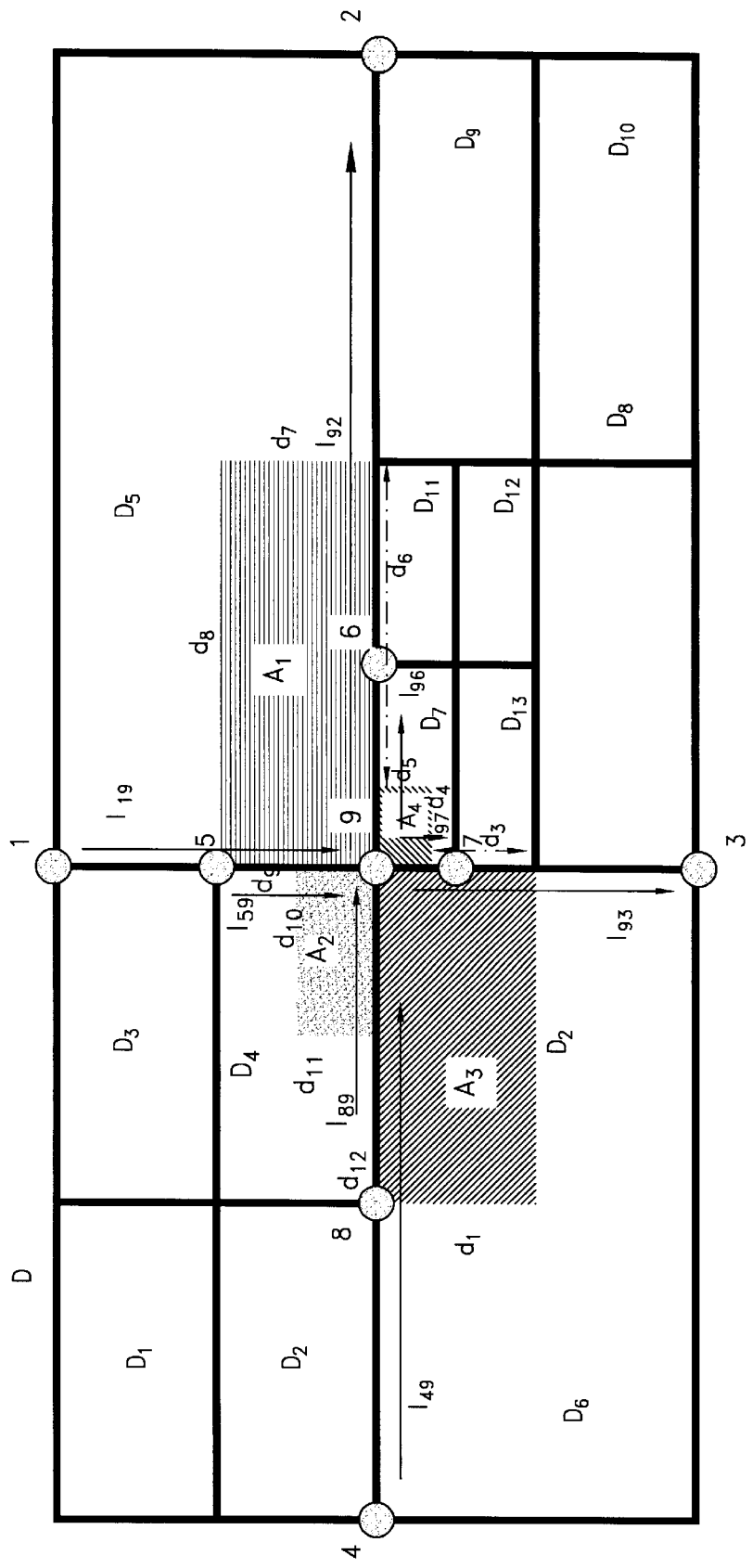
FIG. 5 depicts the node balance assembling technique according to an embodiment of the invention.

The basic features of the CAM algorithm are introduced with an example. Suppose one wants to improve the characteristics of an electronic device, e.g. the maximal electrical potential by modification of one of its parameters, e.g. the distribution of the electrical charge source of the device. This is done by simulation of the electrical potential W(x) in a rectangularly meshed device, given that the electrical system is described by the Poisson equation with $D(x)=\in.E$ (x) the electrical field and $\rho(x)$ the given electrical charge source and x the place coordinate. The rectangular device is represented by a domain D (FIG. 5). A first relation between the electrical field and the electrical potential is given. A second relation between the electrical charge source and the electrical potential is given. As such the Poisson equation can be expressed in terms of the electrical potential.

$$\nabla.D(x)=\rho(x) \rightarrow \nabla^2 W(x)=\rho(W(x))$$

For said simulation the above equation is discretized on a rectangular grid or mesh. Said grid divides the domain D is a set of smaller domains $D_i$. The union of said domains $D_i$ ($D_1$–$D_{13}$) equals D. The equation is now written for each node of the grid. This is further illustrated for the node 9, central in the domain D. Around said node, four rectangular domains $D_5$, $D_7$, $D_6$ and $D_4$ are recognized. In each of said rectangles areas $A_1$, $A_4$, $A_3$ and $A_2$ (shaded in FIG. 5) are defined by taking the middle of the links, defined between the central node and the appropriate nodes of the rectangles. These nodes are denoted in FIG. 5 as black coloured nodes and numbered. Eight such nodes are defined. Said areas together define an overall area $A=A_1+A_2+A_3+A_4$. The above equation is now integrated over said area A and Stokes theorem is applied. The right-hand side is approximated by the electrical charge on said central node. The left-hand side is replaced by a contour-integral of the electrical field along the boundaries of the area A. Said boundaries comprise twelve lines of length $d_i$ ($d_1$–$d_{12}$). Only the electrical field along the links to the central node can be used. In the invented method the electrical field contributions along each such link are separated in two contributions. For instance the electrical field contribution along the horizontal link at the left side of the central node is defined to comprise of a first contribution $I_{49}$, running from node 4 to the central node and a second contribution $I_{89}$, running from node 8 to the central node. $I_{49}$ is related to the rectangle $D_6$ while $I_{89}$ relates to $D_4$. Said contributions are multiplied with the line length of the appropriate line, being the lines, orthogonal to the electrical field contribution under consideration. For the central node this results in the following equation, denoted the node balance:

$$I_{49} \times d_1 + I_{93} \times d_2 + I_{97} \times d_4 + I_{96} \times d_5 + I_{92} \times d_7 + I_{19} \times d_8 + I_{59} \times d_{10} + I_{89} \times d_{11} - \rho_9 \times A = 0$$

For each of the nodes of the mesh such an equation is written. In each equation the relation between the electrical charge $\rho_i$ and the electrical field $I_{ij}$ with the electrical potential is introduced. As such a set of nonlinear equations ($\rho_i$ will depend itself nonlinearly on $W_i$) in the variables $W_i$, being the electrical potential at each node of the mesh, is obtained. Said set of equations is then solved by using an iterative procedure such as a Newton-Raphson scheme. From said simulation one can determine the characteristic under study, e.g. the maximal value of the potential in the device and when necessary modify the electrical charge distribution. In more general terms $I_{ij}$ is denoted a link-current and $\rho_i \times A$ is denoted source contribution. The method can be exploited any structure characteristics of any device under study, determined at a subset of the nodes of the mesh. From said structure characteristics, e.g. the electrical potential, a property, e.g. the maximal value of the electrical potential can be determined.

The CAM algorithm can be written schematically in the following form:

program flux_solver
      call setup rectangle_init an initial mesh of rectangles is generated
      1 call solve_on_rectangles the equations are solved on the current mesh
      call refine_rectangles mesh refinement using the CAM method
      if (refinement_need) go to 1 the refinement is repeated till a predetermined refinement criterion is met
      stop The function solve_on_rectangles can be written schematically in the following form (pseudo-code):

function solve_on_rectangles
      do for each rectangle
         find_variable_in_nodes
         assemble link_current
         do for each node
            assign link_current to node_balance
            assign source_contribution to node_balance
         enddo
      enddo
      solve_equations Note that other orderings of the do-loops are also possible. The solve_equations routine can be any nonlinear equation solver.

According to this embodiment of the invention, a method is disclosed for locally refining a rectangular 2-dimensional mesh in a predetermined domain, wherein the mesh comprises nodes and lines connecting these nodes thereby dividing said domain in 2-dimensional first elements whereby each element is defined by 4 nodes. Particularly, this method, can locally refine an initial mesh comprising 2-dimensional first elements, i.e. rectangles. This method comprises at least the steps of:

creating a first additional node inside at least one of said first rectangles by completely splitting said first rectangle in exactly four second rectangles in such a manner that said first additional node forms a corner node of each of said second rectangles which results in the replacement of said first rectangle by said four second rectangles; and creating a second additional node inside at least one of said second rectangles by completely splitting said second rectangle in exactly four third rectangles in such a manner that said second additional node forms a corner node of each of said third rectangles which results in the replacement of said second rectangle by said four third rectangle.

This first additional node is created somewhere inside a rectangle. This can be anywhere inside a rectangle and thus not on a link (side) of the rectangle. Particularly, this first additional node can be created in the center of the rectangle. Regardless of the exact location of the first additional node, this first rectangle is split completely in exactly four new rectangles, i.e. second rectangles. In other words, the sum of the areas of these four second rectangles completely coincides with the area of this first rectangle and therefore this first rectangle can be deleted. This also holds in an analogous way for the second additional node.

Figure 3:
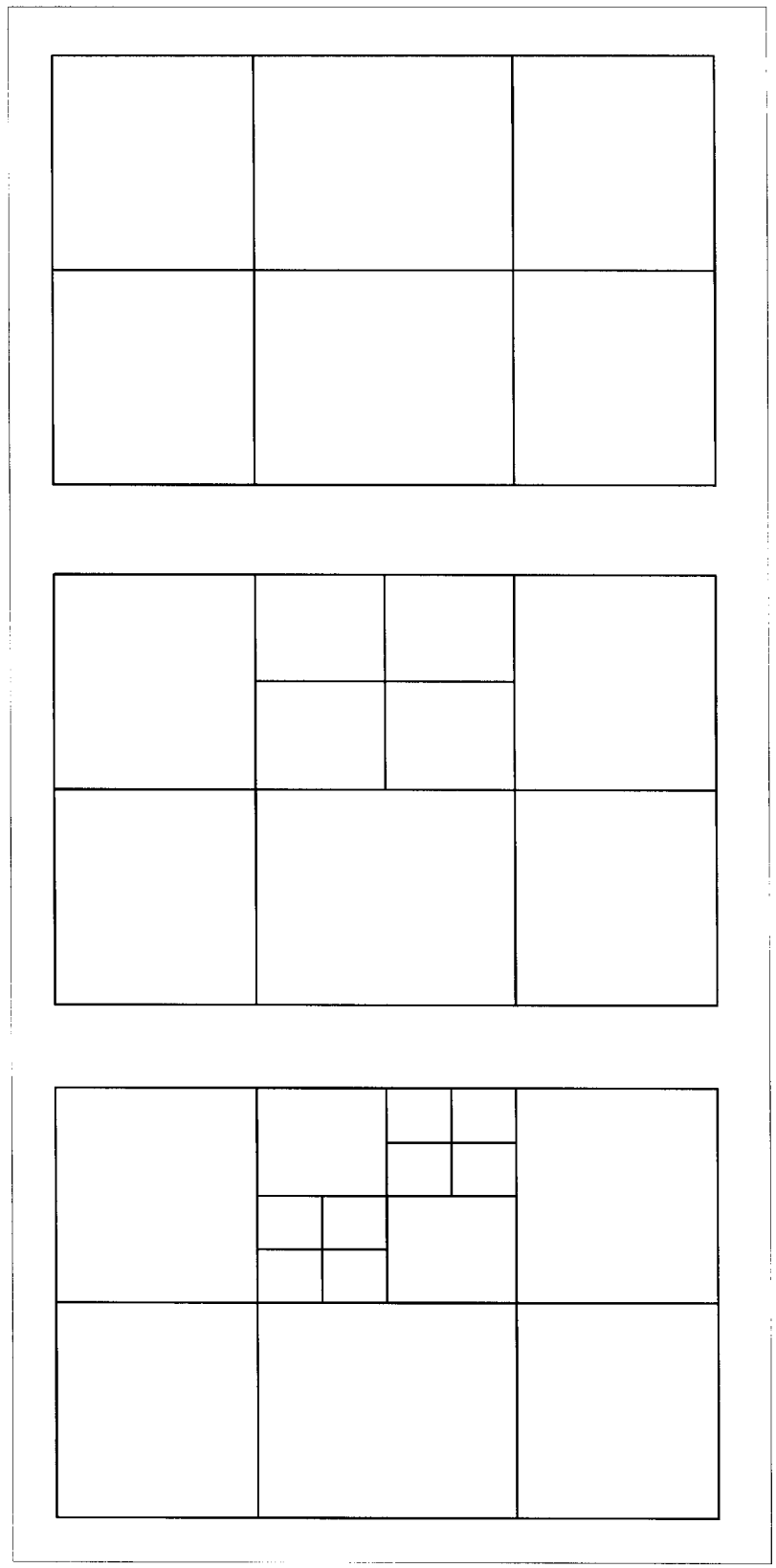
FIG. 3 depicts an initial mesh and this mesh after a first and a second local refinement according to an embodiment of the invention.

In another embodiment the method of the present invention is embedded in an adaptive meshing strategy. Adaptive meshing is straightforward for n-dimensional meshes comprising n-dimensional elements whereby each element is defined by $2^n$ nodes. Particularly adaptive meshing can be easily implemented for a two-dimensional mesh comprising rectangles. There are no restrictions on the number of links ending on another link as e.g. in the finite-box method. Therefore, extra algorithms for smoothing the mesh after the adaptive meshing are not required because there is no metastasis of spurious nodes into irrelevant regions; in other words the refinement remains locally. In FIG. 3, a possible result of such a meshing strategy is shown after two cycles of adaptation.

An important problem in simulation is the use of different physical models on different length scales, or alternatively, using the same physical models at different scales but with modified model parameters. In the latter case, the model parameters follow renormalization group flows, as in K. Wilson "Confinement of Quarks" Phys. Rev. D10, 2445 (1974). Both scenarios can be applied in restricted domains, without blurred transition regions, because the refinement scheme does not generate extra nodes which necessitate subsequent smoothing steps.

Concerning the issue of numerical stability of the method of the present invention, it is demonstrated that sets of equations of the type $$\vec{\nabla} \cdot \vec{J}^{(k)} + \frac{\partial \rho^{(k)}}{\partial t} = S^{(k)};$$

k being a positive whole number
can be solved on a mesh obtained after a series of iterations. The key observation is that each mesh resembles a Kirchhoff network. Particularly, when considering a 2-dimensional rectangular mesh, each current flows along a side (link) of an element and each side accumulates contributions from two adjacent elements (rectangles) sharing this particular link. Moreover, the currents arising from these two elements do not interact and therefore one may assemble each element independently. One has to keep in mind that the expressions for discretized currents in terms of the end point field values generate semi-definite Newton matrices. An adaptive meshing algorithm according to the method of the present invention, i.e. based on the renormalization group refinement method, is created and tested on a series of devices. No signals revealing instability are detected. The most comprehensive simulation is performed on a MOSFET, using the hydrodynamic model for holes and electrons. Solving five equations with the help of a simultaneous Newton solver for a mesh comprising 2000 nodes, no convergence slow-down was observed. The results agreed within 1% with results obtained with conventional schemes.

General Orthogonal Coordinate Systems

Figure 4:
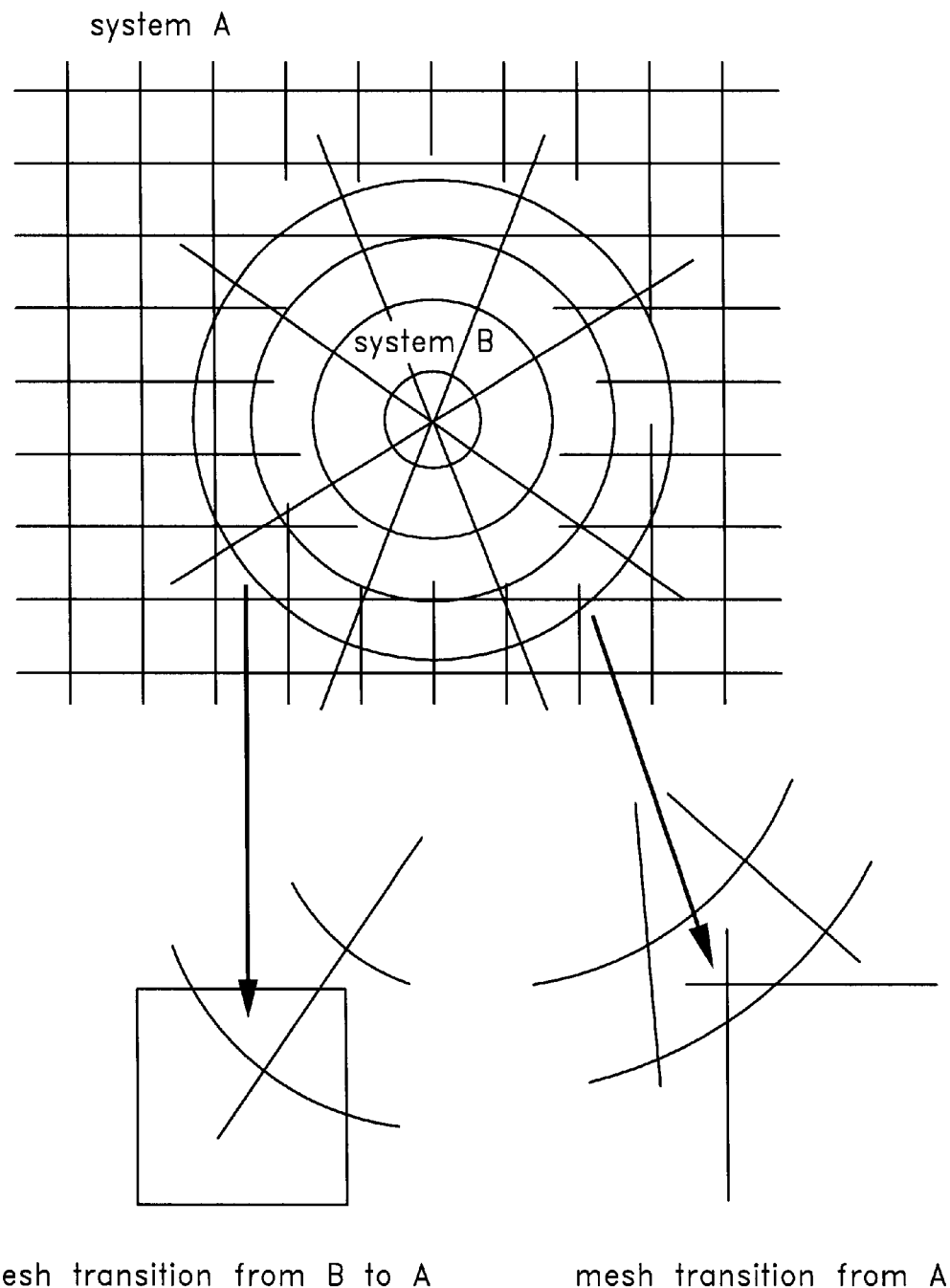
FIG. 4 depicts a transition of a mesh based on a first orthogonal coordinate system to a mesh based on another orthogonal coordinate system using the method of the present invention.

In three dimensions there exists 12 different classes of orthogonal coordinate systems. The orthogonality allows for applying the subdivision of any cell in 4 subcells by taking the mean of the minimum and maximum of the coordinate variables. The orthogonality is a sufficient reason for the guaranty that one does not have to include smoothing nodes. Another interesting application concerns the transition from one coordinate system to another. When using the method of the present invention, there are no restrictions on the number of links ending on another link. Therefore, the absence of smoothing nodes implies that only transition nodes have to be generated at the pre selected interval region. This is done by detecting the nodes in coordinate system A and in the transition region and by assigning refinement nodes to the coordinate system B. In the same way the nodes of coordinate system B lying in the transition region become new nodes for coordinate system A. This is illustrated in FIG. 4. An interpolation function needs to be chosen in order to avoid overdetermination of the system of nodal equations. In other words: The coordinate systems A and B are matched by transition boundary conditions.

In another embodiment of the present invention, a mesh is created using the locally refinement method of the present invention. Thereafter the mesh can be locally coarsened. When solving systems of partial differential equations of the type $$\vec{\nabla} \cdot \vec{J}^{(k)} + \frac{\partial \rho^{(k)}}{\partial t} = S^{(k)};$$

k being a positive whole number
it is often observed that nodes are generated in the adaptive meshing strategy, during the iteration process towards the finally solution, whose existence becomes obsolete, when arriving at the final solution. These nodes are artifacts of the solution procedure and not relevant for describing the final solution with sufficient degree of accuracy. With the method presented here it becomes rather straightforward to clean up the final mesh from these nodes. For this task it is necessary to assign to each node its hierarchy during the generation of the mesh. The initial mesh comprises nodes and first elements and all these nodes obtain generation index 0, i.e. so-called parent nodes. The additional first nodes, which are obtained in the first generation, are given the index 1. These are children nodes. The process is continued by the generation of grandchildren and after X iterations, we obtain nodes from the X-th generation. Mesh coarsening can now be easily executed by deleting the nodes from the last generation and check for sustained accuracy. All parent nodes of a child node, which has been deleted, may now be checked for obsoleteness, and so on.

The Cube-Assembling Meshing method is now demonstrated with the simulation of a microelectronic structure. A detailed exposure of the adaptive meshing strategy in a realistic application is presented. The selected structure is an implanted diode with side contact. The purpose of this example is two-fold: (1) to demonstrate that the new method gives acceptable results, (2) to demonstrate that the method has been implemented in a two-dimensional device simulator, which has served as a research tool for predicting highly unconventional devices, such as hetero-junction type vertical transistors, multi layer HEMTS as well as more conventional structures, such as CMOS devices in operation points where effects are present which are very difficult to simulate, such as carrier heating.

All these structures have in common that commercial software tools do not provide sufficient reliable data for the parameters which are of interest to the process engineer. This situation is due to the fact that software development progresses in parallel with technology development. Having available a source code for the simulation of the internal dynamics inside devices, an ongoing activity has been to improve the algorithms which are exploited in solving the equations underlying the device dynamics. Although many code improvements deal with a gradual extension towards more accurate models to be implemented, occasionally dramatic jumps in code improvements are realized by implementing pieces of code which involve a new understanding of the mathematical machinery which applied.

In the past decade we realized three instances of major breakthrough events in solving the semi-conductor device equations on the computer. In 1988, a method for simulating abrupt hetero structures, by programming finite jumps in the matching conditions of the nodal values of the scalar functions in the finite-element method. In 1993, a method was constructed for obtaining smooth solutions as well as a robust iterative scheme for finding the solutions of the energy-balance equations by realizing that CGS solvers require a semi-definite Newton-Raphson Jacobian matrix. The third 'quantum leap' in improving the algorithm for finding the solutions of the semiconductor device equations was invented in 1998 and is the subject of the disclosed invention.

With decreasing device dimensions, there is an increasing need for the inclusion of quantum effects in the simulation method. Unfortunately, the laws of quantum-mechanics are of a substantially different character as the laws of classical physics, e.g. even in first order quantization, wave-like equations need to be incorporated, which are very different from Poisson equation and balance equations in general which are of the diffusive type. This situation leads to reconsideration of the discretization schemes, with having in mind a method which decouples the macroscopic physics from the microscopic physics. The underlying idea is that quantum effects are important in particular regions of the device but that other parts the device could be described by the classical methods. Furthermore the quantum regime should be entered by locally refining the mesh in order to take into account the fact that the quantum effect are dominate on a small distance scale. A renormalization group transformation should realize the connection between the macroscopic and microscopic domains. Unfortunately, local mesh refinements in adaptive meshing schemes are always accompanied by spurious nodes which take care of a smooth transition between the fine and the coarse mesh. Such spurious nodes are lethal to the developed ideas for incorporating the quantum physics in the simulation method. Therefore, the question, whether it would be possible to incorporate a discretization scheme for the classical device equations, which may be submitted to local refinement without generating a metastasis of the spurious refinement nodes, has raised and been solved by the development of the CAM-scheme. The method combines the finite-element method with the box-integration method and is applicable in an arbitrary number of dimensions. The method is limited to meshes consisting of the union of patches of orthogonal coordinate frames.

Figure 6:
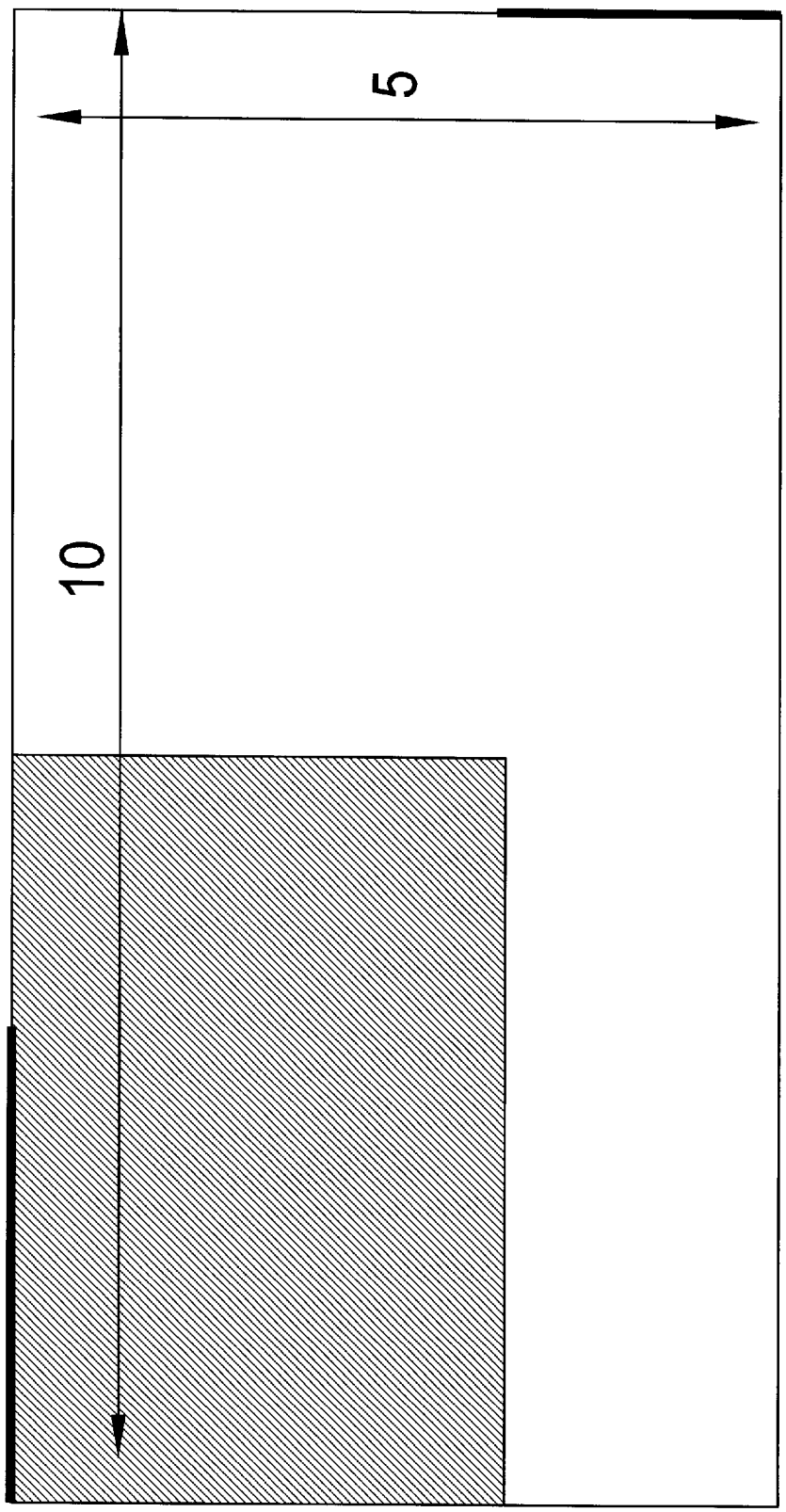
FIG. 6 depicts the structure and lay-out of the rectangular 10 by 5 diode, with two contacts (one in the upper left part and one in the right bottom part) and two different doping regions (in the structure indicated by the shaded and unshaded areas).

The device under consideration consists of a np-diode, whose third dimension is much larger as the first and the second dimension. Therefore, a two-dimensional cross section suffices for the determination of the diode characteristics. In a perpendicular plane, the diode has dimensions 10 times 5 μm squared. A p-type doped region of size 5 times 2.5 μm squared is allocated in the upper left corner with a contact named top, and the the remaining region is n-typed doped. There is a side-wall contact named side connected to the n-type region. When the diode is forward biased, a current flow is expected from the side-wall contact to the top contact. This current is not expected to be one-dimensional due to the perpendicular orientation of the contacts. The adaptive meshing algorithm is expected to allocate refinement nodes such that the current paths can be accurately traced. In FIG. 6 the device lay-out is presented as it is drawn by the PRISM structure generator. The PRISM structure generator is a pre-processor which allows the user to design the geometric aspects as well as other issues, such as material selection, contact positioning and interface positioning.

The input file diode.dat for the simulator PRISM is presented below.

```
TITLE simulation of 5×10 diode structure with adaptive
    meshing
MESH diode.str
SQUARE
* = = = doping-profiles = = =
UNIFORM −1.00E19 0.0 2.5001 5.0 5.0
UNIFORM 1.00E19 0.0 0.0 5.0 2.5
UNIFORM 1.00E19 5.0001 0.0 10.0 5.0
* = = =
DIEL_CON sili 1 11.9
DIEL_CON oxid 1 3.8
* intrinsic concentration of Si:
INTR_CAR sili 1 1.3E10
TEMP 26.0
MOB sili 11 400.1500.0
GF sili 03 f
RECOM sili 1 5000.0 5000.0
BIAS top 0.0 side 0.0
ANAL BIHT
CPUTIM 600.0
* max no newton loops
LOOPS 100
$ solver accuracy:
ACC 1.0d-14 1.0d-14 1.0d-30 1.0d-30 1 500 1.0d-30
    1.0d-35
NORM 1.0d-3 1.0d-2 5.0d-2 1.0d-2 5.0d-2
PRINT diode.out 3
PLOT doping 6 doping
SOLVE
```

At the first run of a new structure the output of the PRISM structure generator is loaded into the PRISM simulation. This is the file diode.str as indicated in the the second line. The file diode.str is printed below. In the section STRUCTURE-LINES for each line the fourth parameter gives the number of line divisions. With this parameter a crude initial mesh for performing initial calculations towards the final solution are generated. These number can be provided interactively with the structure generator.

```
<PRIMI>
<TITLE> <none>
<GRID> 1.000000e+01 5.000000e+00 2.500000e−01
    2.500000e−01
<GEOMETRY>1
<Points>
0.000000e+00 1.250000e+00 1
1.000000e+01 1.250000e+00 1
2.500000e+00 5.000000e+00 1
2.500000e+00 0.000000e+00 1
0.000000e+00 2.500000e+00 1
1.000000e+01 2.500000e+00 1
5.000000e+00 5.000000e+00 1
5.000000e+00 0.000000e+00 1
0.000000e+00 0.000000e+00 1
1.000000e+01 0.000000e+00 1
1.000000e+01 5.000000e+00 1
0.000000e+00 5.000000e+00 1
<Lines>
0.000000e+00 1.250000e+00 0.000000e+00 2.500000e+
    00 1
1.000000e+01 1.250000e+00 1.000000e+01 0.000000e+
    00 1
2.500000e+00 5.000000e+00 5.000000e+00 5.000000e+
    00 1
2.500000e+00 0.000000e+00 0.000000e+00 0.000000e+
    00 1
0.000000e+00 2.500000e+00 0.000000e+00 5.000000e+
    00 1
1.000000e+01 2.500000e+00 1.000000e+01 1.250000e+
    00 1
5.000000e+00 0.000000e+00 2.500000e+00 0.000000e+
    00 1
1.000000e+00 5.000000e+00 1.000000e+01 5.000000e+
    00 1
0.000000e+00 5.000000e+00 2.500000e+00 5.000000e+
    00 1
0.000000e+00 0.000000e+00 5.000000e+00 1.250000e+
    00 1
<EXTEND>0.000000e+00
<STRUCTURE>
<Points>16
1 2.500000e+00 5.000000e+00
2 0.000000e+00 2.000000e+00
3 2.500000e+00 2.500000e+00
. . . .
. . . .
<Lines>24
1 1 3 5 0 0 0
2 2 3 5 0 0 0
3 2 4 5 0 0 0
. . . .
. . . .
```

```
<Areas>9
1 3 4 1 2 1 1
2 1 5 6 7 1 1
. . . .
. . . .
<MIC>
<Materials>1
1 sili
<Contacts>2
7 top
9 side
<Interfaces>0
<END>
```

The execution of PRISM with the input file diode.dat generates two files related to the mesh construction. The first file diode.sqr is a detailed description which contains all structure information for applying the cube assemble method. Part of the file diode.sqr is printed below.

```
TITLE
<none>
NODE
256
   2.50000000E+00  5.00000000E+00
   0.00000000E+00  2.50000000E+00
   2.50000000E+00  2.50000000E+00
   0.00000000E+00  5.00000000E+00
. . . .
. . . .
SQUARES
225
   19 131 132 20 1 1
   212 216 50 49 1 1
   128 20 1 32 1 1
   245 249 250 246 1 1
. . . .
. . . .
INTERFACE
0
CONTACT
17
  4 1
  1 1
  7 2
  . . . .
  . . . .
LOG_NAMES
  2 0 1
C1 1top
C2 1side
M1 1sili
END
```

Figure 7:
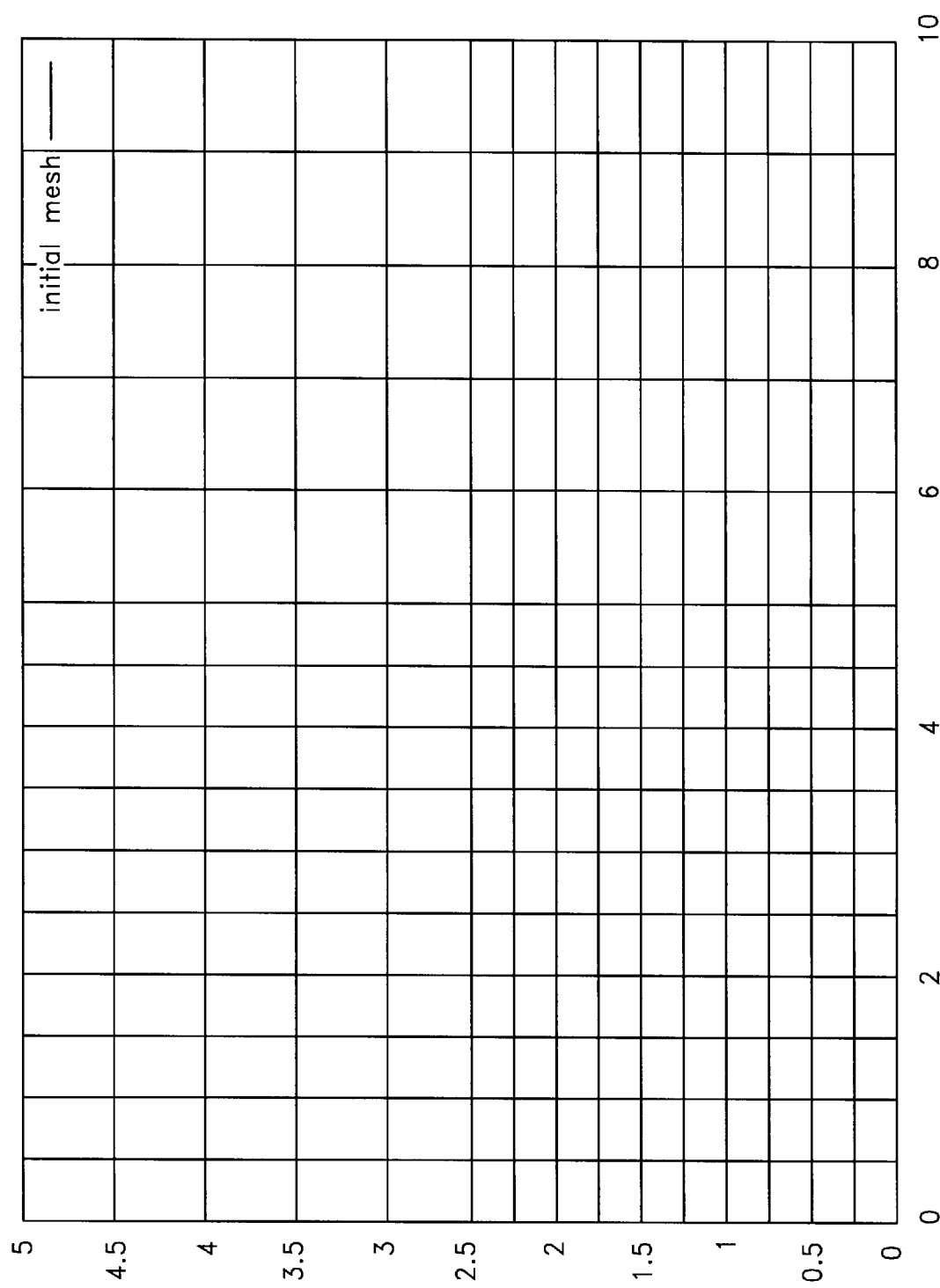
FIG. 7 depicts the initial square mesh of the diode.
Figure 8:
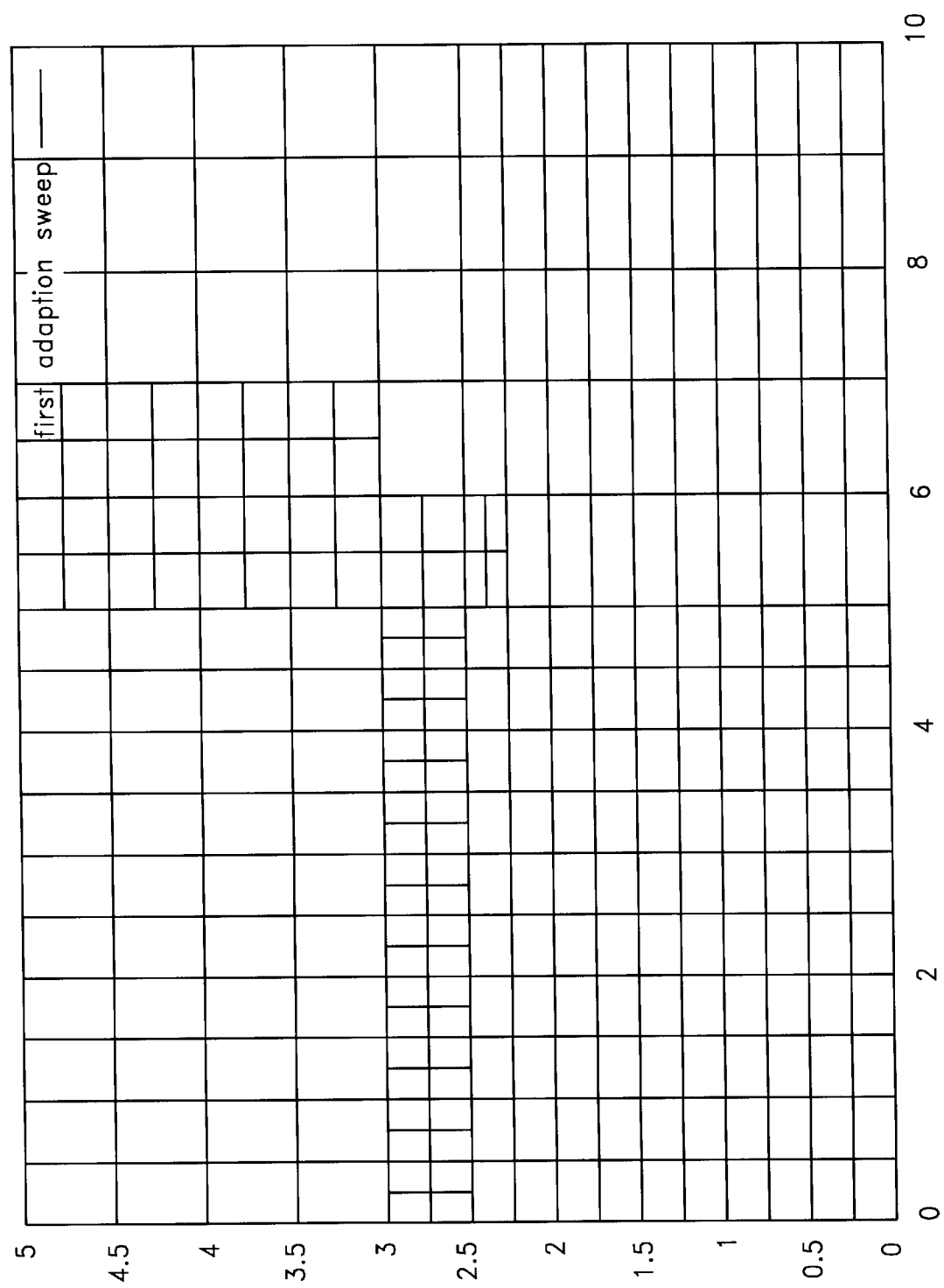
FIG. 8 depicts the square mesh after 1 adaption sweep.
Figure 9:
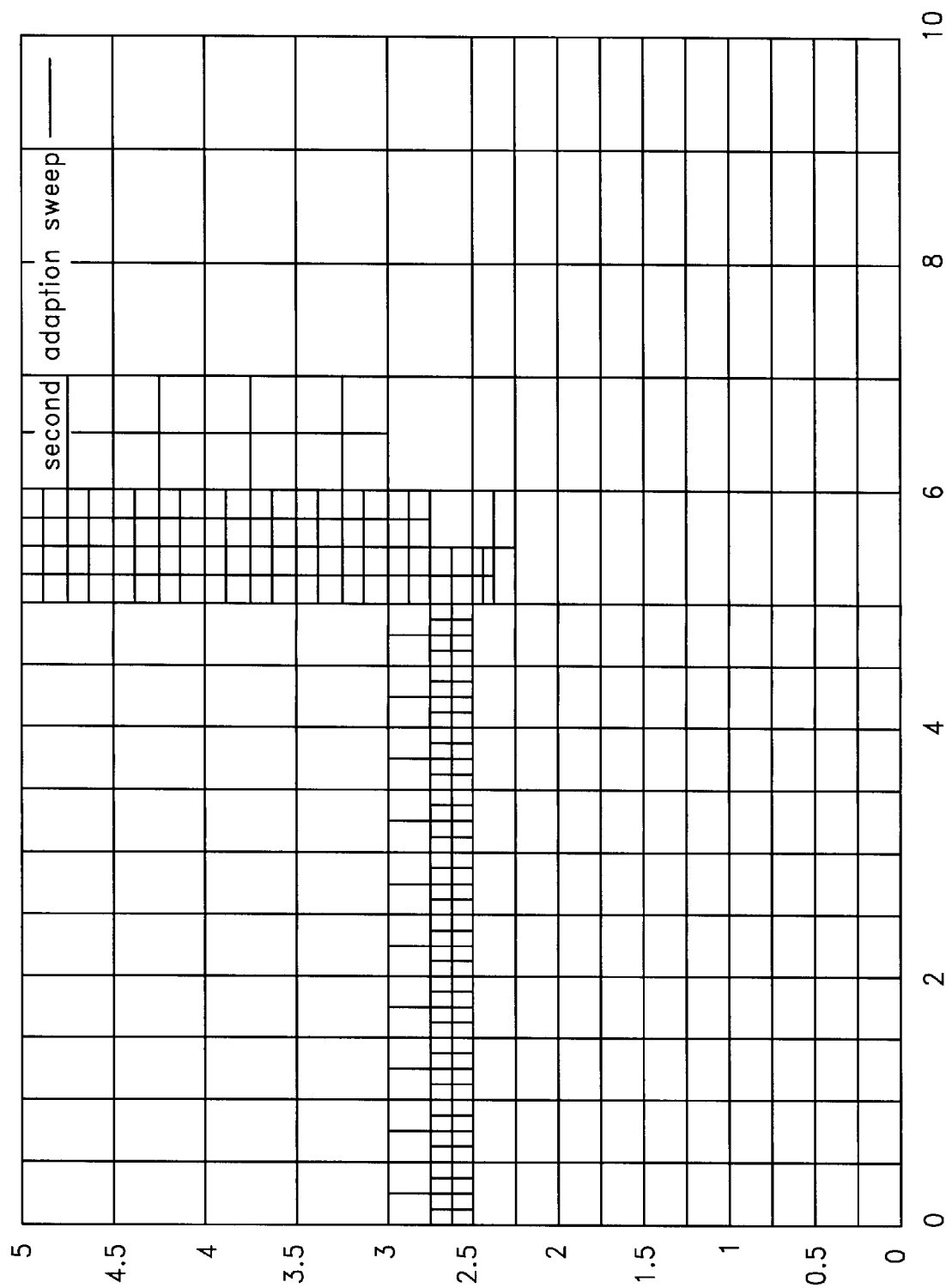
FIG. 9 depicts the square mesh after 2 adaption sweeps.
Figure 10:
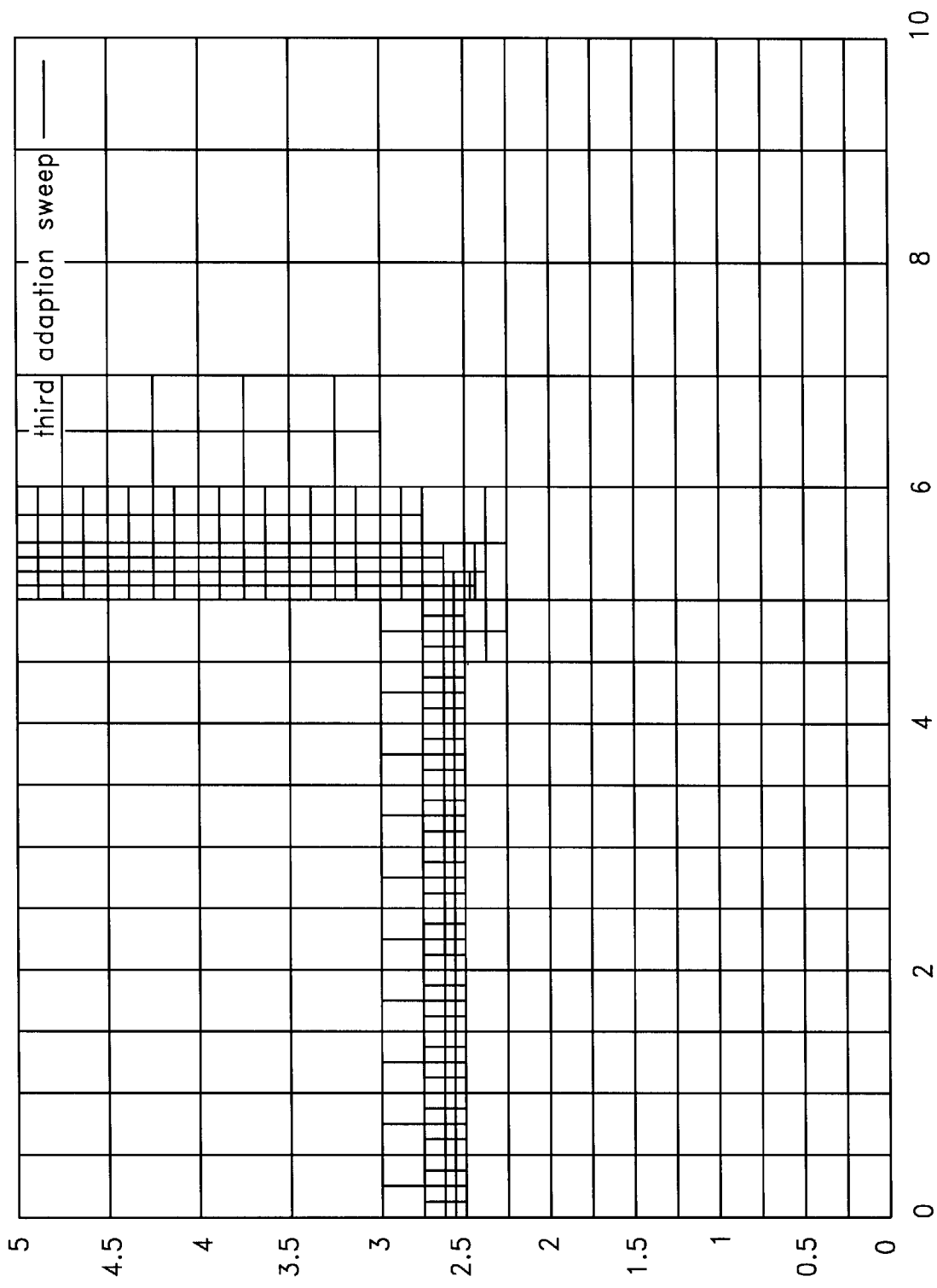
FIG. 10 depicts the square mesh after 3 adaption sweeps.
Figure 11:
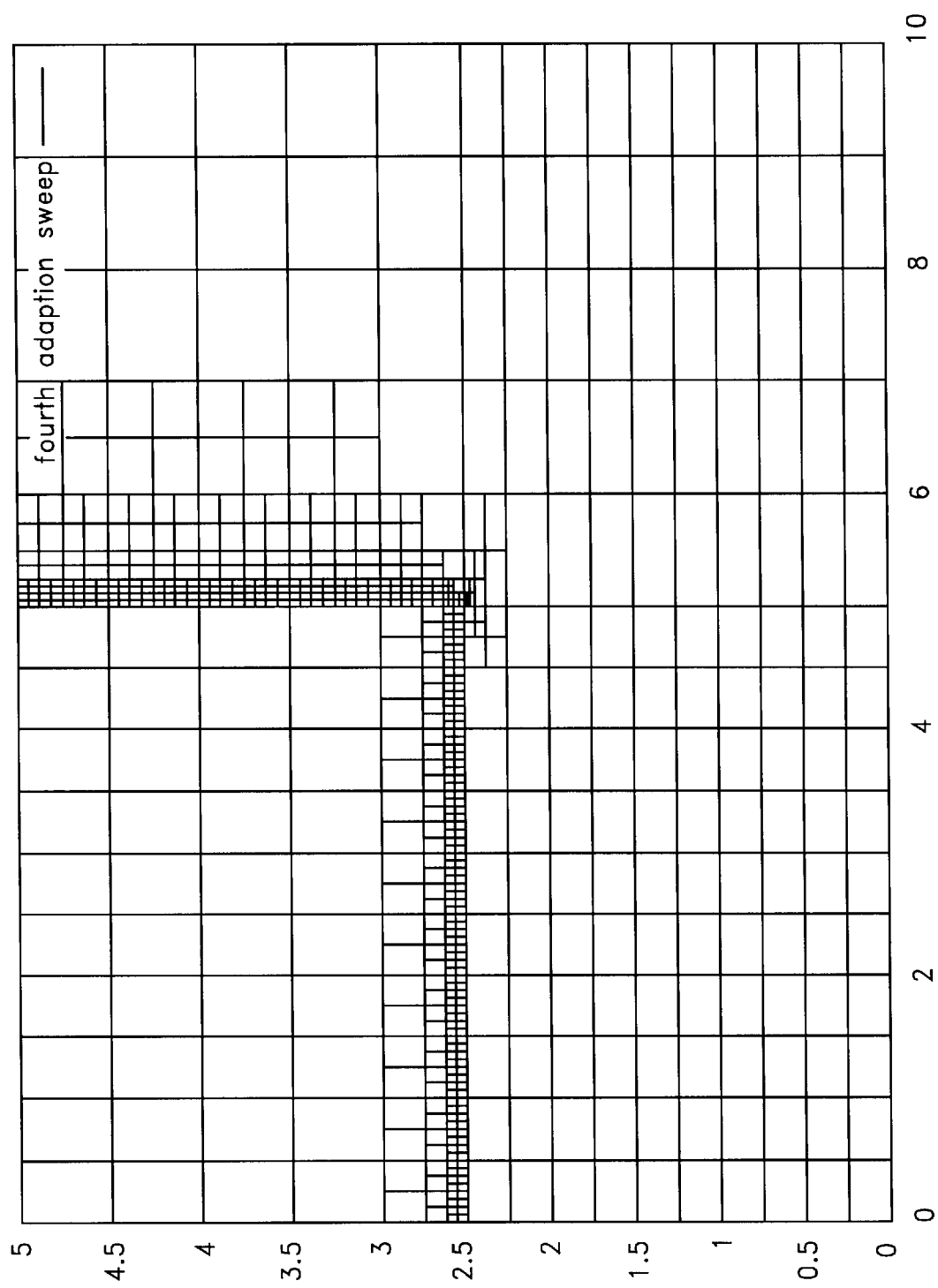
FIG. 11 depicts the square mesh after 4 adaption sweeps.
Figure 12:
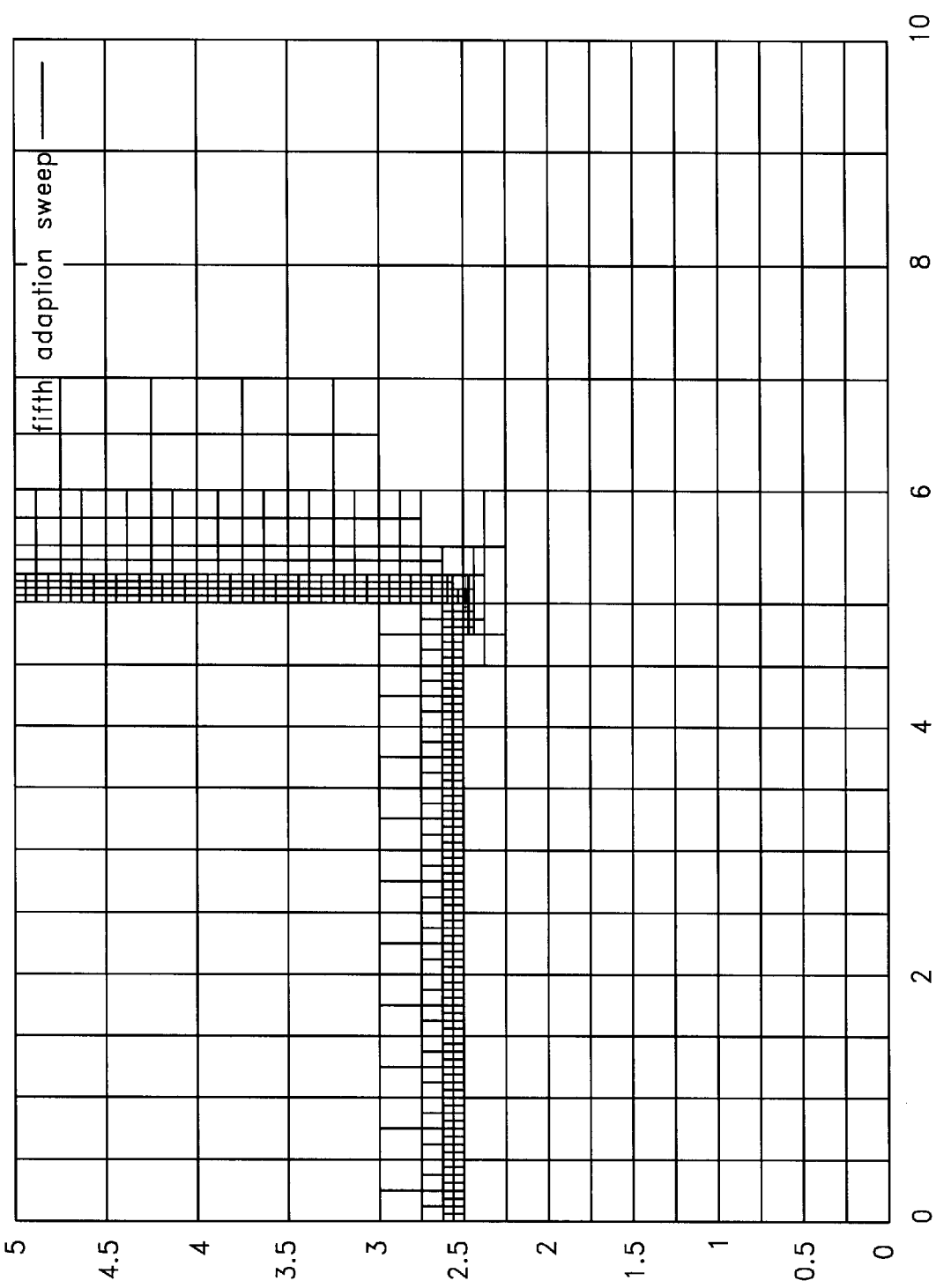
FIG. 12 depicts the square mesh after 5 adaption sweeps.
Figure 13:
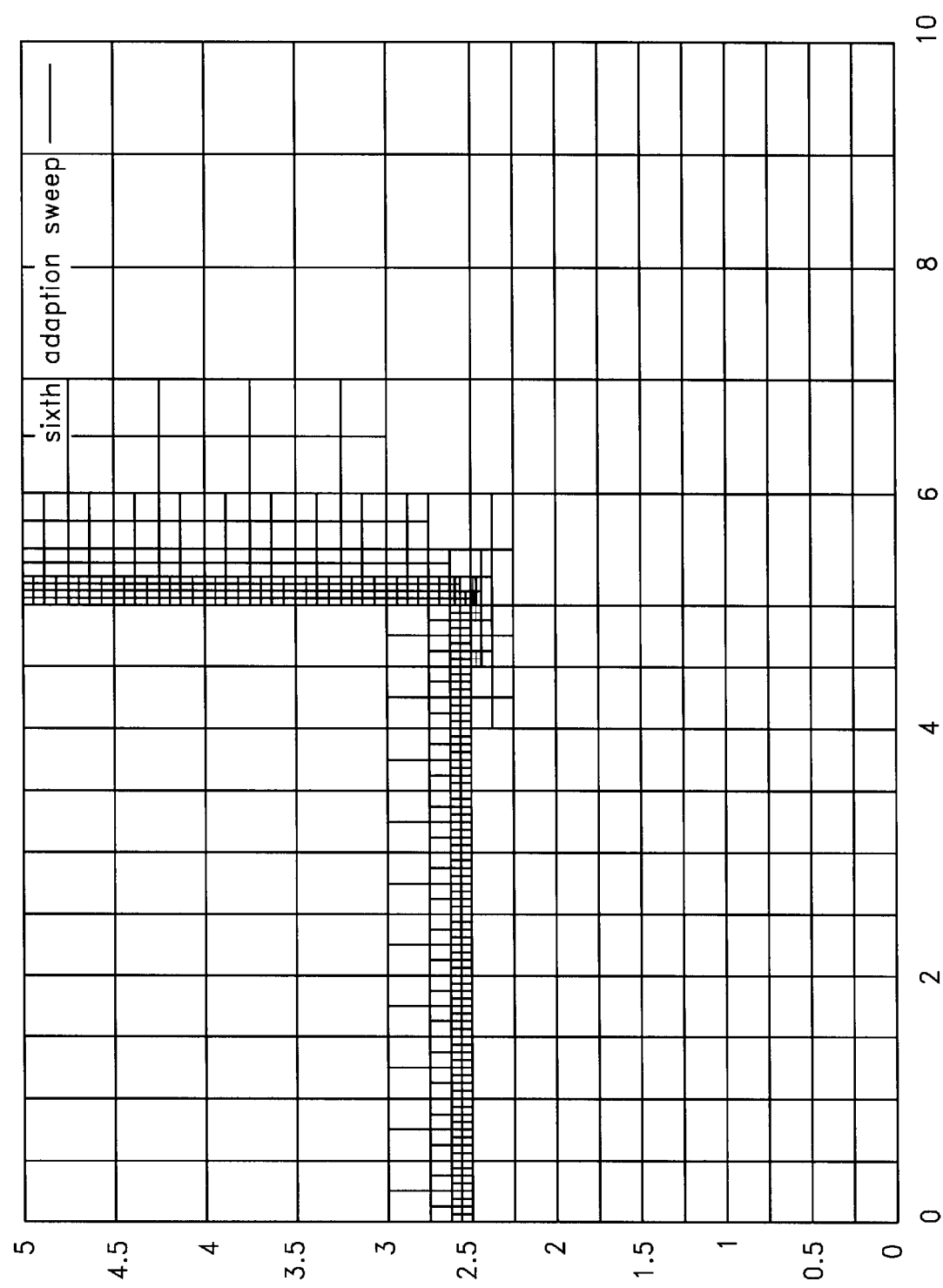
FIG. 13 depicts the square mesh after 6 adaption sweeps.

Furthermore, there is printed a file diode.gpt, which is suitable for drawing the initial mesh using xgnuplot. The plotting is presented in FIG. 7. In order to set up the initial square mesh from the structure file the initial run of the simulation is done without putting bias on the contacts. The BIAS card in the diode.dat file takes care of this aspect. A run without bias usually is fast and is suitable for a syntax analysis and name matching of the input files diode.dat and diode.str. Errors are reported in the output file diode.err. The initial solution should also be quickly obtained (i.e. a limited number of iterations should be used) otherwise there is likely a problem with the doping conditions. Part of the error file diode.err is presented below.

```
Section TITL has been read in.
Section NODE has been read in.
Section ELEM has been read in.
Section CONT has been read in.
Section LOG_ has been read in.
CONTACT information:
   contact #1: length=0.2500E+01 um
   contact #2: length=0.2500E+01 um
PRISM Version 4.0 rev 0, File run of: Dec. 1, 1998 15:43
21 none>
DIEL_CON SILI 1 11.9
DIEL_CON OXID 1 3.8
INTR_CAR sili 1 1.3E10
TEMP 26.0
MOB SILI 11 400.1500.0
Energy balance mobility model E→T (Si)
GF SILI 03 f
No surface scattering included
Field dependent mobility: Arora
RECOM SILI 1 5000.0 5000.0
Shockley-Read-Hall Recombination
ANAL BIHT
CPUTIM 600.0
LOOPS 100
ACC 1.0d-14 1.0d-14 1.0d-30 1.0d-30 1 500 1.0d-30
    1.0d-35
NORM 1.0d-3 1.0d-2 5.0d-2 1.0d-2 5.0d-2
PRINT diode.out 3
DATA
contact nos units 1 2
contact name top side
This mesh contains: 256 nodes, 225 squares.
L2 norms:—Poisson 2.5127E+03
RESOUT: #loops, ERR1, ERR3, ALPHA, BETA, <r0,
    C.p(k)>
|| 0 |2.51E+03 | 0.00E+00 || 0.00E+00 0.00E+00 0.00E+00
   ||
|| 2 |7.01E-20 | 0.00E+00 || 1.00E+00 4.55E-20 7.01E-20
   ||
   dpsi 3.70E-04 at node 37 Time is 0.02
UPDATE1: loop iij=0 damp TK=0.10000E+01 Time is
   0.02
applied bias V 0.00000E+00 0.00000E+00
L2 norms:—Poisson 4.1071E-01
RESOUT: #loops, ERR1, ERR3, ALPHA, BETA, <r0,
    C.p(k)>
|| 0 |4.11E-01 | 0.00E+00 || 1.00E+00 4.55E-20 7.01E-20
   ||
|| 2 |2.41E-27 | 0.00E+00 || 1.00E+00 4.57E-20 2.41E-27
   ||
   dpsi 6.85E-08 at node 37 Time is 0.02
UPDATE1: loop iij=0 damp TK=0.10000E+01 Time is
   0.02
THE CGS-PC METHOD STOPPED DYNAMICALLY.
   ALFA=-0.244083E-30
NO OF ITERATIONS=18
```

DAMP1: damping factors TK,TK1=0.10000E+01 0.10000E+01
UPDATE dpsi=1.57E-10 d0p=1.11E-10 d0n=1.87E-14
  at nodes(40) (71) (113)
L2 norms:—Poisson 2.1668E-08
L2 norms: Hole eqn 1.5673E-08
L2 norms: Hole temp 1.5482E-07
L2 norms: Elec eqn 2.4257E-08
L2 norms: Elec temp 2.2549E-07
  Total 2.7590E-07 Time is 0.07
CONVERGED: Current imbalance 7.0425D-12
ICLU: maximum |dii|_LU=0.58987E+05 minimum |dii|_LU=0.96854E-05
ICLU: maximum |dii|_AN=0.10000E+01 minimum |dii|_AN=0.16953E-04
  at A row 3 at A row 6
ICLU: Number of corrected entries=4
RESOUT: #loops, ERR1, ERR3, ALPHA, BETA, <r0, C.p(k)>
||0 |5.38E-10 |6.47E-10 || -5.29E-02 -1.28E+00 -8.27E-27||
THE CGS-PC METHOD STOPPED DYNAMICALLY. ALFA=-0.534617E-30
NO OF ITERATIONS=31
DAMP1: damping factors TK,TK1=0.10000E+01 0.10000E+01
UPDATE dpsi=1.25E-10 d0p=1.28E-10 d0n=1.04E-10
  at nodes(69) (6) (39)
    dtemp=1.44E-17 dtemn=1.94E-17
  at nodes(178) (38)
16 16
Creating file doping.ddca
Creating file doping.ddca
Newmesh:Ny=16 Nx=16
with 0 interpolated values A summary file of the results is also produced which provides the biases at the contact and the resulting currents. The file is printed below.

PRISM Version 4.0 rev 0, File run of: Dec 1, 1998 15:43
DIEL_CON SILI 1 11.9
DIEL_CON OXID 1 3.8
INTR_CAR sili 1 1.3E10
TEMP 26.0
MOB SILI 11 400. 1500.0
Energy balance mobility model E→T (Si)
GF SILI 03 f
No surface scattering included
Field dependent mobility: Arora
RECOM SILI 1 5000.0 5000.0
Shockley-Read-Hall Recombination
ANAL BIHT
CPUTIM 600.0
LOOPS 100
ACC 1.0d-14 1.0d-14 1.0d-30 1.0d-30 1 500 1.0d-30 1.0d-35
NORM 1.0d-3 1.0d-2 5.0d-2 1.0d-2 5.0d-2
PRINT diode.out 3
DATA
contact nos units 1 2
contact name top side
CONVERGED: Current imbalance 9.5643D-15
CONVERGED: Current imbalance 7.0425D-12
applied bias V 0.00000E+00 0.00000E+00
Sheet charge Ccm-1 -6.19394E-23 1.32711E-22
Hole current Acm-1 6.26567E-10 5.57167E-31
Elec current Acm-1 1.72112E-27 -6.19524E-10
Integrated electron conc 3.7624E+12 cm-1
Integrated hole conc 1.2374E+12 cm-1
Total run time>0.917E-01 mins Having obtained an initial mesh as well as a zero bias solution, one may proceed along different tracks. First a mesh refinement according to doping criteria and/or electric field criteria may be done. Other criteria do not make much sense at zero bias. One may also first ramp up the bias to some particular value and apply mesh adaption at the final stage. Which method is selected is not relevant for demonstrating the feasibility of the Cube-Assembling Method, since in both cases the method should final mesh should result into a stable and convergent solution scheme. Which new nodes are ultimately participating depends on the history of the application of the refinement criteria and the order of applying first adaption and then refinement or first ramping and then adaption may effect the presence of final nodes.

Following the first option, i.e. applying adaption on the zero-bias solution, we obtain refinement according to the doping and electric-field profile. In FIG. 8 to FIG. 13 six succesive meshes are obtained by resubmitting the zero-bias solution to the refinement tests based on the doping profile. In the following table the number of new nodes is given.

| Cycle | New nodes | Total |
|---|---|---|
| 0 | 0 | 256 |
| 1 | 78 | 334 |
| 2 | 153 | 487 |
| 3 | 306 | 793 |
| 4 | 286 | 1079 |
| 5 | 6 | 1085 |
| 6 | 7 | 1092 |

Figure 14:
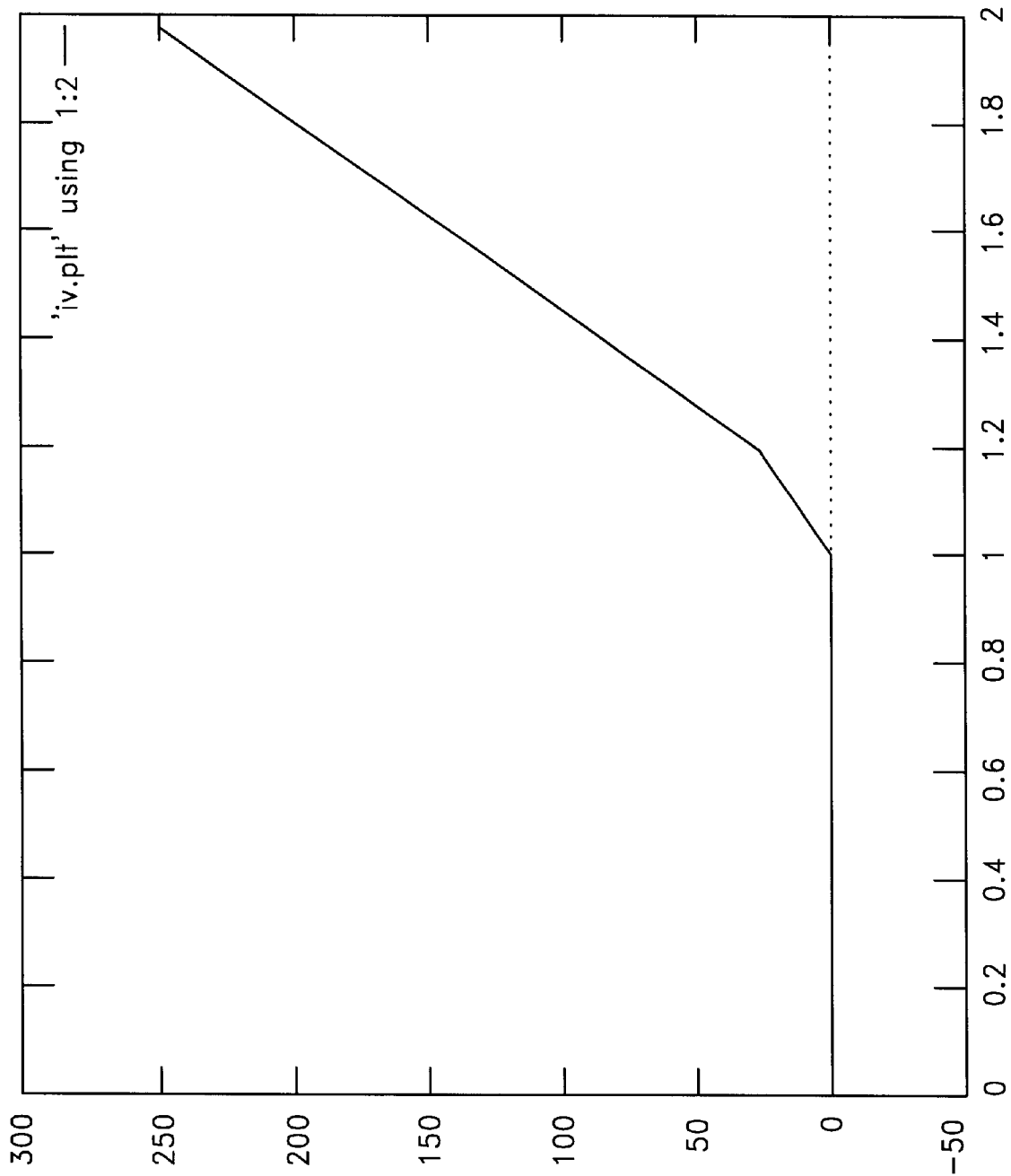
FIG. 14 depicts the current-voltage plot. X-axis is voltage, Y-axis is current.

A current-voltage plot is persented in FIG. 14. The convergence speed is similar to the zero-bias case, which demonstrates that the cube-assembling method works properly. As such, it was demonstrated that a new assembling strategy based on a synthesis of the finite-element method and the box-integration method which allows mesh refinement without spurious nodes, does give a algorithm which is stable, robust and convergent.

What is claimed is:

1. A method of modeling at least one characteristic of a device, the method comprising:
    generating, in a computer, a n-dimensional mesh in a predetermined domain, wherein the mesh comprises nodes and n−1 planes connecting these nodes thereby dividing the domain in n-dimensional first elements wherein each element is defined by $2^n$ nodes, and wherein the n-dimensional mesh models the at least one characteristic of the device;
    creating a first additional node inside at least one of said first elements by completely splitting said first element in exactly $2^n$ nodes n-dimensional second elements in such a manner that said first additional node forms a corner node of each of said second elements which results in the replacement of said first element by said $2^n$ n-dimensional second elements;

creating a second additional node inside at least one of said second elements by completely splitting said first element in exactly $2^n$ nodes n-dimensional third elements in such a manner that said second additional node forms a corner node of each of said third elements which results in the replacement of said first element by said $2^n$ n-dimensional third elements;

providing at least one equation for each node of the n-dimensional mesh; and solving together each of the provided equations.

2. The method of claim 1, wherein after locally refining said n-dimensional mesh, said n-dimensional mesh is locally coarsened.

3. The method of claim 1, wherein said refinement is based on an adaptive meshing strategy.

4. The method of claim 1, wherein the device comprises an electronic circuit device.

5. The method of claim 1, wherein the device comprises an electronic circuit that is part of a semiconductor integrated circuit.

6. The method of claim 1, wherein the characteristic is an electrical potential of a device.

7. The method of claim 1, wherein each of the provided equations comprises a node balance that is indicative of at least two link currents across a link to each of the respective nodes.

8. A program storage device, storing instructions that when executed by a computer perform the method comprising:

generating, in a computer, a n-dimensional mesh in a predetermined domain, wherein the mesh comprises nodes and n−1 planes connecting these nodes thereby dividing the domain in n-dimensional first elements wherein each element is defined by $2^n$ nodes, and wherein the n-dimensional mesh models the at least one characteristic of a device;

creating a first additional node inside at least one of said first elements by completely splitting said first element in exactly $2^n$ n-dimensional second elements in such a manner that said first additional node forms a corner node of each of said second elements which results in the replacement of said first element by said $2^n$ n-dimensional second elements;

creating a second additional node inside at least one of said second elements by completely splitting said second element in exactly $2^n$ n-dimensional third elements in such a manner that said second additional node forms a corner node of each of said third elements which results in the replacement of said second element by said $2^n$ n-dimensional third elements;

providing at least one equation for each node of the n-dimensional mesh; and solving together each of the provided equations.

9. The program storage device of claim 8, wherein the device comprises an electronic circuit device.

10. The program storage device of claim 8, wherein the device comprises an electronic circuit that is part of a semiconductor integrated circuit.

11. The program storage device of claim 8, wherein the characteristic is an electrical potential of a device.

12. The program storage device of claim 8, wherein each of the provided equations comprises a node balance that is indicative of at least two link currents across a link to each of the respective nodes.

13. A method of modeling at least one characteristic of a device, the method comprising:

generating, in a computer, a n-dimensional mesh in a predetermined domain, wherein the mesh comprises nodes and n−1 planes connecting these nodes thereby dividing the domain in n-dimensional first elements wherein each element is defined by $2^n$ nodes, and wherein the n-dimensional mesh models the at least one characteristic of the device;

creating a first additional node inside at least one of said first elements by completely splitting said first element in exactly $2^n$ nodes n-dimensional second elements in such a manner that said first additional node forms a corner node of each of said second elements which results in the replacement of said first element by said $2^n$ n-dimensional second elements;

creating a second additional node inside at least one of said second elements by completely splitting said first element in exactly $2^n$ nodes n-dimensional third elements in such a manner that said second additional node forms a corner node of each of said third elements which results in the replacement of said first element by said $2^n$ n-dimensional third elements;

providing at least one equation for each node of the n-dimensional mesh;

solving together each of the provided equations, wherein the solved equations provides modeling information that is indicative of the characteristic of the device; and displaying said modeled information.

14. The method of claim 13, wherein the device comprises an electronic circuit device.

15. The method of claim 13, wherein the device comprises an electronic circuit that is part of a semiconductor integrated circuit.

16. The method of claim 13, wherein the characteristic is an electrical potential of a device.

17. The method of claim 13, wherein each of the provided equations comprises a node balance that is indicative of at least two link currents across a link to each of the respective nodes.

* * * * *